United States Patent
Caduff et al.

(10) Patent No.: US 7,365,664 B2
(45) Date of Patent: Apr. 29, 2008

(54) ADC WITH DYNAMIC RANGE EXTENSION

(75) Inventors: Christian Caduff, Bern (CH); Régis Caillet, Boudry (CH)

(73) Assignee: Emma Mixed Signal C.V., Amsterdam (NL)

( * ) Notice: Subject to any disclaimer, the term of this patent is extended or adjusted under 35 U.S.C. 154(b) by 0 days.

(21) Appl. No.: 11/499,671

(22) Filed: Aug. 7, 2006

(65) Prior Publication Data

US 2007/0120721 A1    May 31, 2007

(30) Foreign Application Priority Data

Aug. 10, 2005   (EP) ................................ 05017345

(51) Int. Cl.
*H03M 1/00* (2006.01)

(52) U.S. Cl. ...................... 341/139; 341/155; 455/132; 348/725

(58) Field of Classification Search ................ 341/139, 341/155, 118; 375/345, 260; 381/92, 57; 348/725

See application file for complete search history.

(56) References Cited

U.S. PATENT DOCUMENTS

| | | | |
|---|---|---|---|
| 4,630,302 A * | 12/1986 | Kryter | ........................ 381/57 |
| 4,999,628 A | 3/1991 | Kakubo et al. | |
| 5,202,686 A | 4/1993 | Rapp et al. | |
| 5,812,679 A | 9/1998 | Killion et al. | |
| 5,978,490 A * | 11/1999 | Choi et al. | ..................... 381/92 |
| 6,097,443 A | 8/2000 | Volmari | |
| 6,554,762 B2 | 4/2003 | Leysieffer | |
| 6,678,011 B2 * | 1/2004 | Yanagi et al. | ................ 348/725 |
| 6,690,735 B1 * | 2/2004 | Maddiotto et al. | ........... 375/260 |
| 6,859,504 B1 * | 2/2005 | Kowalski | ..................... 375/345 |
| 6,879,274 B2 * | 4/2005 | Nestler et al. | .............. 341/118 |
| 6,963,733 B2 * | 11/2005 | Eriksson et al. | ............. 455/132 |
| 2003/0091207 A1 | 5/2003 | Killion et al. | |
| 2004/0057593 A1 * | 3/2004 | Pedersen et al. | ............ 381/321 |

* cited by examiner

*Primary Examiner*—Jean B Jeanglaude
(74) *Attorney, Agent, or Firm*—Bacon & Thomas, PLLC

(57) ABSTRACT

ADC circuitry has a first programmable gain amplifier to amplify an analog input, a first analog to digital converter coupled to an output of the first amplifier, a second programmable gain amplifier, to amplify the analog input, a second analog to digital converter coupled to an output of the second amplifier, and a digital circuit for deriving a digital output from the outputs of the first and second converters and a controller for controlling the gains of the first and second amplifiers, according to the outputs of the first and second converters. Such programmable gain pre amplifiers help enable effective dynamic range to be extended without unduly increasing the number of quantisation bits, or the number of components or the power dissipation. It can be used in applications sensitive to size and power, such as DSP based acoustic devices including hearing aids.

12 Claims, 2 Drawing Sheets

ADC WITH DYNAMIC RANGE EXTENSION

FIELD OF THE INVENTION

The invention relates to circuits for ADC, to microphone systems having such circuits, and to corresponding methods.

DESCRIPTION OF THE RELATED ART

Analog and digital hearing aids are known. One problem has been the degraded sound quality caused by un-damped peaks. This can be solved with "electronic damping" as described in U.S. Pat. No. 5,812,679, for example. However, in most cases, a readily accessible switched capacitor filter design suitable for that application has had a relatively high noise level. In order to overcome this noise level, a switchable pre-amplifier preceding the switched capacitor filter and a switchable attenuator following the switched capacitor filter was introduced. If the gain of the preamplifier was matched to the attenuation of the attenuator, it was possible to switch the gain in and out, but the time delay of the variable capacitor filter caused a click each time the gain was automatically switched in and out as the level increased or decreased.

It is known to use several analog to digital converters (ADC) to increase the dynamic range in digital hearing aids. The use of several analog to digital converters is reported in US patent application 2003/0091207 A1 and U.S. Pat. No. 6,554,762 B2. In US 2003/0091207 A1 a first low-amplitude preamplifier is selected for low level signals generated by a microphone and a second high-amplitude preamplifier is selected for high level signals generated by the microphone. The gain of the low-amplitude preamplifier is larger than the gain of the high amplitude preamplifier. Typically for hearing aids application, the two gains will differ by 24 dB.

The output of the first preamplifier is fed to a first analog to digital converter and the output of the second preamplifier is switched to the converter or fed to a second analog to digital converter. When the amplitude of the signal generated by the microphone is above a first level, the output of the low level amplifier saturates and as such is not usable for processing, because of too large harmonic distortions, the only signal that is used for further processing comes from the high amplitude preamplifier. When the amplitude of the signal generated by the microphone is below a second level, the output of the high level amplifier is so low that it is not usable for processing because the noise level is too close to the signal level (not enough SNR), the only signal that is used for further processing comes from the low amplitude preamplifier. When the amplitude of the signal generated by the microphone lies between the first and second levels, it may be advantageous to combine the bits strings generated by both analog to digital converters. But this is no mean task since it requires that both analog to digital converters are triggered by the same sampling signal (synchronism on a time scale below the μs is required to prevent the combination of the two bit strings introducing distortions). Another major problem with the arrangement described here is the sudden increase of noise level when the system switches from one preamplifier to the other. When the amplitude of the input signals varies from (just) above the first level to (just) below the second level (from below the second level to above the first level), the gain varies from Gmin to Gmax (Gmax to Gmin) and the level of noise varies from Gmax Ntot to Gmin Ntot (Gmax Ntot to Gmin Ntot) where Ntot is the total input equivalent noise (e.g. as seen at the input of the preamplifier) affecting the signal. The human hear is extremely sensitive to noise level variations. Abrupt changes in noise level variations that may be expected with abrupt gain changes, is troubling, even disagreeable, to humans.

In U.S. Pat. No. 6,554,762 B2, a hearing aid with an arbitrary number of microphones, each having a fixed gain preamplifier and an analog to digital converter, is shown. There remains a need for improved apparatus.

SUMMARY OF THE INVENTION

An object of the invention is to provide an improved circuit for ADC, to a microphone system having such a circuit, and to corresponding methods. According to a first aspect, the invention provides:

An apparatus comprising a first programmable gain amplifier arranged to amplify an analog input, a first analog to digital converter coupled to an output of the first amplifier, a second programmable gain amplifier, also arranged to amplify the analog input, a second analog to digital converter coupled to an output of the second amplifier, and a digital circuit for deriving a digital output from the outputs of the first and second converters and a controller for controlling the gains of the first and second amplifiers, according to the outputs of the first and second converters and the controller being arranged to change the gain of one of the programmable amplifiers while an output of its associated converter is not selected.

Compared to the cited prior art, the use of programmable gain pre amplifiers helps enable the inputs to the ADCs to be maintained at amplitudes which provide good quantisation, even over wide ranges of input signal amplitude. In particular, more different gain levels can be provided without needing more fixed gain amplifiers. Hence the effective dynamic range can be extended without unduly increasing the number of quantisation bits, or the number of components or the power dissipation. This makes it particularly suitable for applications which are sensitive to size and power, such as DSP (Digital Signal Processor) based acoustic devices and in particular hearing aids.

An additional feature of some embodiments is a selector for selecting an output of one of the converters as an output signal, according to the outputs of the first and second digital converters. In principle, the outputs can be mixed as is known, but this alternative of selecting from the outputs, helps avoid the need for tight synchronisation of sampling, and so keeps the complexity lower for a given accuracy.

The digital circuit being arranged to change the gain of one of the programmable amplifiers while an output of its associated converter is not selected helps to avoid output of unwanted transients during settling of the amplifiers. The present invention includes the use of a means for allowing a preamplifier to settle, especially when the gain of the preamplifier increases.

Another such additional feature is the digital circuit being arranged to scale the output according to the applied gain of the amplifier being used. This can optionally be carried out later, if the scaling factor is stored. Other features and advantages are discussed below.

The present invention also provides a method of converting an analog signal having the steps of using a first programmable gain amplifier to amplify an analog input, converting an output of the first amplifier to digital format, using a second programmable gain amplifier to amplify the analog input, and converting an output of the second amplifier to digital format, and deriving a digital output from the outputs of the first and second converters and controlling the gains of the first and second amplifiers, according to the outputs of the first and second converters, and changing the gain of one of the programmable amplifiers while an output of its associated converter is not selected.

The present invention also provides a hearing aid comprising a first amplifier arranged to amplify an analog input, a first analog to digital converter coupled to an output of the first amplifier, a second amplifier, also arranged to amplify the analog input, a second analog to digital converter coupled to an output of the second amplifier, whereby the first amplifier has a fixed gain (e.g. 6 dB) and the second amplifier is programmable. For example, the second amplifier can switch between two levels (e.g. 0 dB and 12 dB).

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DESCRIPTION OF THE ILLUSTRATIVE EMBODIMENTS

Figure 1:
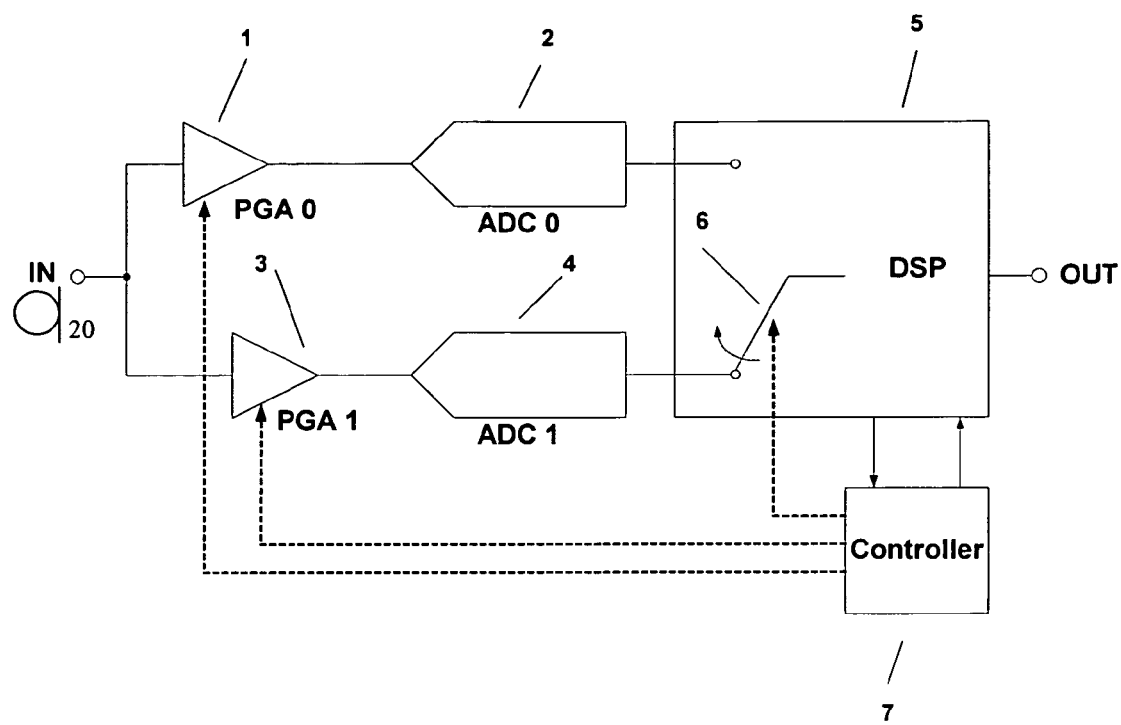
FIG. 1 shows a block level schematic view of an analog to digital conversion system according to an embodiment of the present invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The embodiments described are concerned with making it possible to amplify the input signal with a gain chosen between N different values of gains with less than N preamplifiers thereby enabling setting the gain to suit the requirements of a particular application without having to increase the power dissipation and the size of the circuit. Multiplying the number of components is not desired in general and for hearing aids in particular because it increases power dissipation (hence decreases battery lifetime) and increases the size of the device including the silicon chip, the dimensions of device being strictly limited by the size of the ear canal.

The embodiments are also concerned with avoiding abrupt changes in gain and hence avoiding abrupt noise level variations, which are noticeable and disturbing in known microphone systems. Another concern is distortion caused by poor synchronisation of samples for mixing, e.g. if sampling is not done at the exact same moment of time for both analog to digital converters, a combination of the two resulting bit strings introduces distortions audible as "clicks". The delay difference can arise from different preamplifier settings: it is a problem resulting from the finite gain-bandwidth product of the amplifier. For example, the delay of the analog input signal can increase with the gain. On a typical chip the delay between 0 dB gain and 30 dB gain is 6.5 us. With older methods this preamp delay had to be corrected by delaying the sampling clock for the low-gain channel.

Another concern is settling time for the amplifiers. When the gain of a preamplifier is changed, it takes a finite amount of time for the output of that preamplifier to settle to a value corresponding to both the amplitude of the input signal and the new gain of the preamplifier. During that interval of time, the signal at the output of the preamplifier should not be used in order not to introduce distortions. To that end, a counter is optionally used to determine when the signal at the output of a preamplifier has settled and may be used for further processing.

A preferred embodiment of the invention is illustrated on FIG. 1. The output of a first programmable gain preamplifier 1 is connected to the input of a first analog to digital converter 2. The output of a second programmable gain preamplifier 3 is connected to the input of a second analog to digital converter 4. A switch 6 under the control of a controller 7 allows the selection of either the first analog to digital controller 2 or second analog to digital controller 4 to generate the output of the digital signal processor 5. The controller 7 also sets the gains of the programmable gain preamplifiers 1 and 3. A microphone 20 is shown for generating the analog input, though other sources can be envisaged for other applications. In the case of hearing aids, the digital output can be fed to other filtering or processing circuits as desired and to an audio output device such as a miniature speaker or other device.

The first and second amplifiers are connected in parallel to an analog signal source. The bit strings generated by both ADC's (Analog to Digital Converter) are fed to a DSP where a digital output signal is generated according to:

IF channel selection=0 then

Out=$ADC0$/Gain 0

Else

Out=$ADC1$/Gain 1

Where Gain 0 is the gain of the first programmable gain amplifier and Gain 1 is the gain of the second programmable gain amplifier, channel selection is a control signal, ADC0 is the result of the analog to digital conversion by the first analog to digital converter and ADC1 is the result of the analog to digital conversion by the second analog to digital converter. In particular, both analog to digital converters can be known sigma delta $\Sigma\Delta$ converters. Such converters work with any type of A/D-converter. If an output of one of the converters is selected, rather than mixing the outputs, then the clock signal that provides a sampling trigger for both the first and second analog to digital converters need not necessarily be the same or synchronised for both the analog to digital converters.

An overall method of operation of the digital circuit to control the operation of the system for analog to digital conversion in accordance with an embodiment of the present invention, is as follows:
- receive a bit string from a first analog-to-digital converter preceded by a first Programmable Gain Amplifier (PGA);
- if needed, e.g. if the gain of the first PGA is not optimum for the given dynamic conditions, programmed the gain of a second PGA preceding a second analog-to-digital converter;
- wait for the output of that second amplifier to settle,
- receive a bit string from the second analog-to-digital converter preceded by the second re-programmed PGA, and
- scale the data according to the gain of the second programmable gain amplifier.

The inputs of both the first and second programmable gain preamplifiers 1 and 2 are connected to the same input signals. The dynamic range for both AD converters is typically 90 dB (e.g. 16 bits). The system can work with any type of converter, and is indifferent to the dynamic range of the individual converter. The gain for both preamplifiers 1 and 2 typically varies between 0 and 24 dB, or between 0 and 30 dB, or other values, the embodiments are applicable to any values, and may vary like powers of 2, e.g. the gains that are typically programmable or selectable are 1, 2, 4, 8, 16 or 32.

Figure 2:
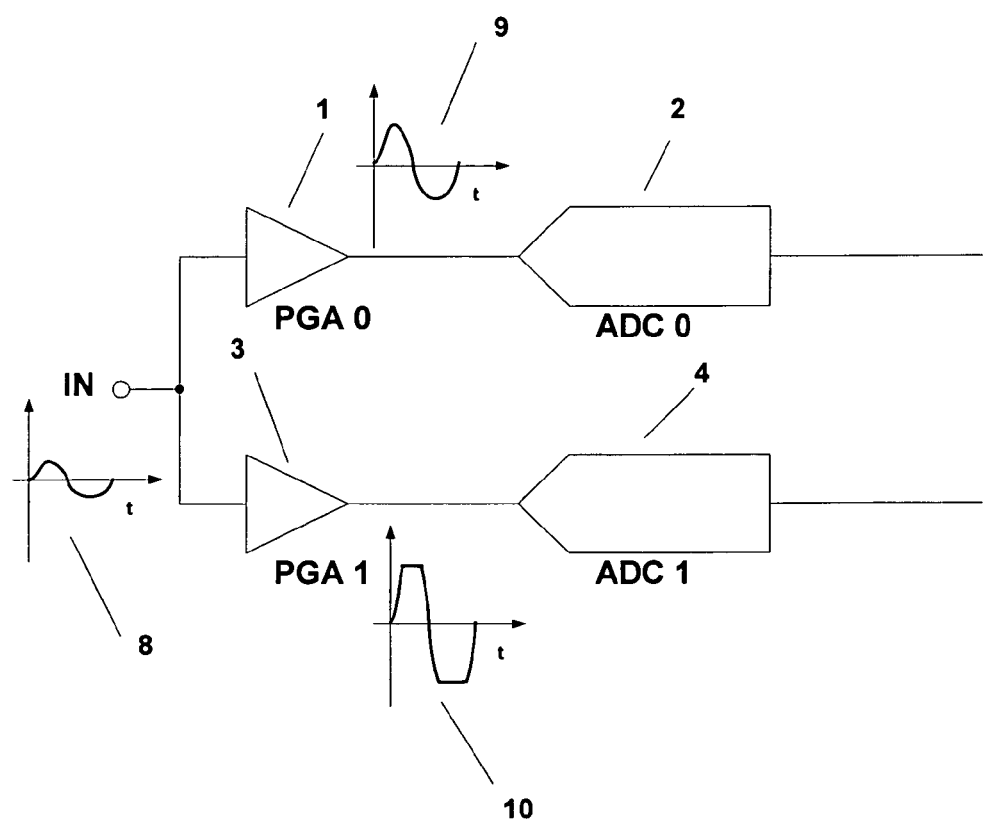
FIG. 2 illustrates a similar circuit and shows waveforms in use, according to an embodiment of the present invention.

FIG. 2 illustrates a similar circuit and shows waveforms in use, according to an embodiment, and concerns the problem of saturation of the preamplifiers. The amplitude of the input signal (as seen on waveform 8) and the gain of preamplifier PGA 1 are such that the output of one preamplifier is saturated (see clipping of the signal on waveform 10), while the other path, with a lower gain is not saturated (see the signal on waveform 9).

In FIG. 2, the amplitude of the input signal is high enough to bring one of the preamplifiers with its current programmed or selected gain in saturation: the output signal is distorted, unfit for high end audio applications in general and hearing aids in particular. For example, the apparatus also comprises a first counter "Counter 1" and a second counter "Counter 2". In particular, these counters may be implemented within the controller 7. How these counters are used will be explained below. The apparatus also comprises a register that is used to follow-up the gain variations and indicate the magnitude of the scaling that must be applied to the digital signal that is generated at the output of the DSP 5. That register is further referred to as the Bit_Shift register and its content is further referred to as Bit_Shift.

Figure 3:
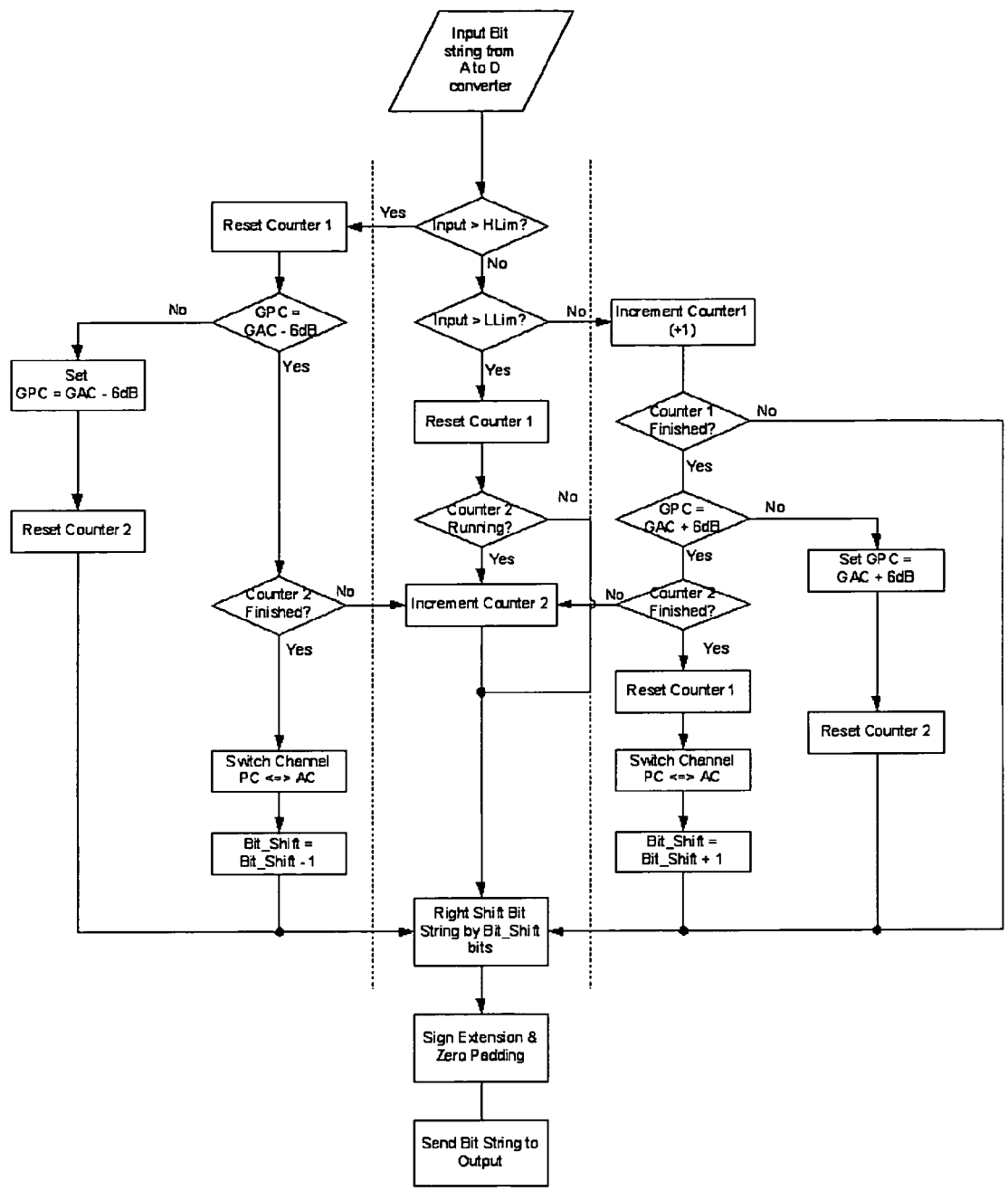
FIG. 3 shows a flow chart showing a method of operation of an analog to digital conversion system according to an embodiment of the present invention

Steps of a method to operate the apparatus described here above in accordance with an embodiment of the present invention are illustrated in FIG. 3. Bit strings are generated by the analog to digital converters 1 and 3 in the active channel AC (e.g. the path of the analog to digital conversion system that is selected by means of switch 6 to generate the digital signal at the output of the DSP 5) and in the passive channel PC (e.g. the path of the analog to digital conversion system that is not selected by means of switch 6 to generate the digital signal at the output of the DSP 5.) Both bit strings are kept available. The value represented by the selected bit string is compared to a first threshold HLim. If the value is higher than HLim a first course of action is taken to program the gain GPC of the preamplifier in the passive channel PC to a gain that is lower than the gain GAC of the preamplifier in the active channel AC.

If the value is lower than a first threshold HLim and higher than a second threshold LLim, a second course of action is taken where the gain GPC of the preamplifier in the passive channel is not modified. If the value lies below a second threshold, a third course of action is taken to program the gain GPC of the preamplifier in the passive channel PC to a gain that is higher than the gain GAC of the preamplifier in the active channel AC.

A more detailed description of the first, second and third courses of action now follows. As shown on FIG. 3, in a first course of action, if the value represented by the selected bit string is higher than a first threshold HLim, the controller 7 resets a first counter "counter 1". The controller 7 then compares the gain GPC of the preamplifier in the passive channel to the gain GAC of the active channel. If GPC=GAC−6 dB, the gain of the preamplifier in the passive channel is not modified and the controller verifies that enough time has elapsed since the last time the gain GPC of the same preamplifier was modified. The verification is done with the second counter "counter 2" that is reset whenever the gain GPC of the preamplifier in the passive channel is modified. If enough time has elapsed, e.g. counter 2 has reached a predetermined limit which is a function of the gain, the position of switch 6 is modified. The active channel becomes passive and the channel that was passive becomes active. To take the new gain into account, Bit_Shift is decremented by 1. To generate the digital signal at the output of the DSP, the selected bit string is shifted to the right by Bit_Shift bits. Here it will be noted that a gain increase of 6 dB corresponds to a gain increase by a factor 2 while shifting a bit string to the right by 1 bit corresponds to a division by 2. Shifting the bit string to the right by Bit_Shift bits allows us to take the successive gain variations into account. Sign extension and zero padding are performed and the resulting digital signal is made available at the output of the DSP.

If the gain GPC of the preamplifier in the passive channel is not equal to the gain GAC of the active channel minus 6 dB of gain, the controller 7 sets the gain GPC to GAC minus 6 dB and resets the counter "counter 2". To generate the digital signal at the output of the DSP, the selected bit string is shifted to the right by Bit_Shift bits. Sign extension and zero padding are performed and the resulting digital signal is made available at the output of the DSP.

If the value represented by the selected bit string lies between a first and a second threshold, respectively HLim and LLim, a second course of actions is taken. Counter 1 is reset. If counter 2 has not yet reached a predetermined limit, counter 2 is incremented otherwise, counter 2 is left unmodified (neither reset nor incremented). To generate the digital signal at the output of the DSP, the selected bit string is shifted to the right by Bit_Shift bits. Sign extension and zero padding are performed and the resulting digital signal is made available at the output of the DSP.

If the value represented by the selected bit string is smaller than a second threshold LLim, a third course of action is taken where the controller 7 increments counter 1 by 1 then verifies the state of counter 1. If counter 1 has reached a predetermined limit N, it means that the value represented by the selected bit string has been inferior to LLim N times in a row and that it is necessary to either increase the gain GPC of the preamplifier in the passive channel or to change the position of switch 6. The controller 7 compares the gain GPC of the preamplifier in the passive channel to the gain GAC of the preamplifier in the active channel. If GPC=GAC+6 dB, the gain of the preamplifier in the passive channel is not modified and the controller verifies with the help of counter 2 that enough time has elapsed since the last time the gain GPC of the same preamplifier was modified. This is done with the help of counter 2 as explained above. If enough time has elapsed, e.g. counter 2 has reached a predetermined limit that can be a function of the gain, the position of switch 6 is modified. The active channel becomes passive and the channel that was passive becomes active. To take the new gain into account, Bit_Shift is decremented by 1. Here it will be noted that a gain increment of 6 dB corresponds to a gain multiplied by 2 while shifting a bit string to the right by 1 bit corresponds to a multiplication by 2 of the numerical value represented by that bit string. To generate the digital signal at the output of the DSP, the selected bit string is shifted to the right by Bit_Shift bits. Sign extension and zero padding is performed and the resulting digital signal is made available at the output of the DSP.

If the gain GPC of the preamplifier in the passive channel is not equal to the gain GAC of the active channel plus 6 dB, the controller 7 sets the gain GPC to GAC+6 dB and resets the counter "counter 2". To generate the digital signal at the output of the DSP, the selected bit string is shifted to the right by Bit_Shift bits. Sign extension and zero padding are performed and the resulting digital signal is made available at the output of the DSP.

The reason why there is no timer (or a shorter timer) to allow settling time when gain is reduced is that the system should switch as fast as possible if there is suddenly a large input signal. Otherwise the signal could saturate during a too long time. Counter1 is provided to not increase the gain if the signal goes below the LLim threshold only briefly.

Another useful feature is being able to turn off completely the passive channel when not used, to save power. If the input is above HLim or if Counter1 reaches its limit the passive channel has to be turned on. The limit of Counter2 has to be increased because it's not only to wait on the stabilization of the preamp but also to give time to the preamp and ADC to boot up and stabilize.

In typical applications the audio input signal will stay for a long time on small amplitudes and the system will be on its maximum gain and it will not switch between the channels. E.g. typically a hearing aid wearer will often be in a quiet place, not talking with others or listening to a radio or other sounds. So there will only be one channel powered and the power consumption is the same as if there is no Dynamic Range Extension (DRE) system. Only when the DRE system switches, the two channels are activated at the same time (during a time corresponding to Counter2 limit).

In the embodiments described, there is the ability to program the gain of the amplifiers that precede the analog to digital converters: it is possible to amplify the input signal with a gain chosen between N different values of gains with less than N preamplifiers thereby enabling to program the gains in function of the requirements of a particular applications without having to increase the power dissipation and the size of the circuit. Another consequence is that the gain of the preamplifier may be programmed dynamically to optimize the amplitude of the signal at the input of the analog to digital converter corresponding to that preamplifier. The higher number of available gains that cover a given range of input signals means that the gain and hence noise level variations are less likely to be abrupt than in the known art. Another advantage of some embodiments is that it does not require synchronous operation of two or more analog to digital converters, thereby dealing with the above mentioned concerns associated with the routing of the clock signal to the two analog to digital converters.

A further embodiment of the invention relates to a hearing aid with a first preamplifier having a fixed gain, e.g. 6 dB and the output of the first preamplifier 1 being connected to the input of the first analog to digital converter 2. The second amplifier is a programmable amplifier. For example it can switch between two values of amplification, e.g. between 0 and 12 dB. The output of a second programmable gain preamplifier 3 is connected to the input of a second analog to digital converter 4. A switch 6 under the control of a controller 7 allows the selection of either the first analog to digital controller 2 or second analog to digital controller 4 to generate the output of the digital signal processor 5. The rest of the circuit is as described above. The combination of a fixed gain amplifier with an amplification gain at an intermediate level between two values of a switchable amplifier provides a reduced but sufficient range of capabilities.

For any of the embodiments of the present invention and as discussed above, the digital circuit can be arranged to determine if the output signal is outside a given range to determine if the gain should be changed. The digital circuit can be arranged to determine a next gain value according to whether the output signal is above or below the given range, and to cause the controller to program the gain of the amplifier not currently selected, to the next gain value. The selector can be arranged to wait for the output of the amplifier programmed to the next gain value to settle, before selecting the converter output corresponding to this amplifier. There can be a reduced wait where the next gain is a reduced gain, so that rapid increases in signal level are dealt with more quickly. Measures can be taken to reduce a power consumption of a converter or amplifier not currently selected. The apparatus can be applied to a microphone system having the apparatus described, and a microphone for generating the analog input. This can be part of a hearing aid suitable for use in or on an ear. More details of implementation of such hearing aids can be found in the literature known to those skilled in the art and in the above referenced patents and patent applications.

A corresponding method of converting an analog signal has the steps of using a first programmable gain amplifier to amplify an analog input, converting an output of the first amplifier to digital format, using a second programmable gain amplifier to amplify the analog input, and converting an output of the second amplifier to digital format, and deriving a digital output from the outputs of the first and second converters and controlling the gains of the first and second amplifiers, according to the outputs of the first and second converters.

The digital circuit and the controller can be implemented using conventional circuitry such as ASICs or a microcontroller, or a DSP chip for example, to suit the application. Software for controlling the hardware can be written using conventional languages as would be apparent to those skilled in the art.

Other variations can be envisaged within the claims.

The invention claimed is:
1. Apparatus comprising:
a first programmable gain amplifier arranged to amplify an analog input,
a first analog to digital converter coupled to an output of the first amplifier, a second programmable gain amplifier, also arranged to amplify the analog input, a second analog to digital converter coupled to an output of the second amplifier, a digital circuit for selecting a digital output of one of the converters as an output signal and for determining if the selected output signal is outside a given range, whereby the digital circuit also determines if the gain of the first or the second programmable amplifier should be changed, and a controller for controlling the gains of the first and second amplifiers according to the outputs of the first and second converters, wherein the controller being arranged to change the gain of one of the programmable amplifiers while an output of its associated converter is not selected.

2. The apparatus of claim 1 whereby the selection of an output of one of the converters as an output signal is done according to the outputs of the first and second digital converters.

3. The apparatus of claim 2, arranged to reduce a power consumption of a converter or amplifier not currently selected.

4. The apparatus of claim 2, the digital circuit being arranged to determine a next gain value according to whether the output signal is above or below the given range, and to cause the controller to program the gain of the amplifier not currently selected, to the next gain value.

5. The apparatus of claim 4, the selector being arranged to wait for the output of the amplifier programmed to the next gain value to settle, before selecting the converter output corresponding to this amplifier.

6. The apparatus of claim 5 having a reduced wait where the next gain is a reduced gain.

7. The apparatus of claim 1, the digital circuit being arranged to scale the output according to the applied gain of the amplifier being used.

8. A microphone system having the apparatus of claim 1 and a microphone for generating the analog input.

9. A hearing aid suitable for use in or on an ear, and having the microphone system of claim 8.

10. A method of converting an analog signal comprising the steps of:

using a first programmable gain amplifier to amplify an analog input, converting an output of the first amplifier to digital format, using a second programmable gain amplifier to amplify the analog input, converting an output of the second amplifier to digital format, selecting a digital output of one of the converters as an output signal, determining whether the selected output signal is outside a given range and determining whether the gain of the first or the second programmable amplifier should be changed, controlling the gains of the first and second amplifiers, according to the outputs of the first and second converters, and changing the gain of one of the programmable amplifiers while an output of its associated converter is not selected.

11. A hearing aid comprising:

a first amplifier arranged to amplify an analog input, a first analog to digital converter coupled to an output of the first amplifier, a second amplifier, also arranged to amplify the analog input, a second analog to digital converter coupled to an output of the second amplifier, a digital circuit for selecting a digital output of one of the converters as an output signal and for determining if the selected output signal is outside a given range, wherein the first amplifier has a fixed gain and the second amplifier is programmable.

12. The hearing aid of claim 11, wherein the second amplifier is adapted to switch between two amplification levels.

* * * * *